US010559481B2

(12) United States Patent
Morimoto et al.

(10) Patent No.: US 10,559,481 B2
(45) Date of Patent: *Feb. 11, 2020

(54) PLASMA PROCESSING APPARATUS AND PLASMA PROCESSING METHOD

(71) Applicant: HITACHI HIGH-TECHNOLOGIES CORPORATION, Tokyo (JP)

(72) Inventors: Michikazu Morimoto, Yamaguchi (JP); Yasuo Ohgoshi, Yamaguchi (JP); Yuuzou Oohirabaru, Yamaguchi (JP); Tetsuo Ono, Yamaguchi (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 244 days.

This patent is subject to a terminal disclaimer.

(21) Appl. No.: 15/056,142

(22) Filed: Feb. 29, 2016

(65) Prior Publication Data
US 2016/0181131 A1 Jun. 23, 2016

Related U.S. Application Data

(63) Continuation of application No. 13/185,598, filed on Jul. 19, 2011.

(30) Foreign Application Priority Data
Mar. 30, 2011 (JP) .................................. 2011-076585

(51) Int. Cl.
H01L 21/67 (2006.01)
H01J 37/32 (2006.01)
(Continued)

(52) U.S. Cl.
CPC .. H01L 21/67069 (2013.01); H01J 37/32146 (2013.01); H01J 37/32192 (2013.01);
(Continued)

(58) Field of Classification Search
USPC ............ 156/345.24–345.28, 345.35, 345.36, 156/345.41–345.49; 118/723 E, 723 ER,
(Continued)

(56) References Cited

U.S. PATENT DOCUMENTS 4,941,152 A 7/1990 Medan
5,562,952 A 10/1996 Nakahigashi et al.
(Continued)

FOREIGN PATENT DOCUMENTS

JP 62-57321 A 3/1987
JP 08-250479 A 9/1996
(Continued)

OTHER PUBLICATIONS

JP Office Action for Japanese Application No. 2011-076585, dated Aug. 26, 2014.
(Continued)

Primary Examiner — Rakesh K Dhingra
(74) Attorney, Agent, or Firm — Baker Botts L.L.P.

(57) ABSTRACT

Provided are a plasma processing apparatus with a radio-frequency power supply supplying temporally modulated intermittent radio-frequency power which can be controlled with high precision in a wide repetition frequency band, and a plasma processing method using the plasma processing apparatus.

A plasma processing apparatus includes: a vacuum vessel; a plasma generating section plasma in the vacuum vessel; a stage installed in the vacuum vessel and mounted with a sample; and a radio-frequency power supply applying temporally modulated intermittent radio-frequency power to the stage, wherein the radio-frequency power supply has two or more different frequency bands and temporally modulates
(Continued)

the radio-frequency power by a repetition frequency which has the same range of analog signals used in each of the frequency band.

4 Claims, 10 Drawing Sheets

(51) Int. Cl.
  *H01L 21/66*  (2006.01)
  *H01L 21/3065*  (2006.01)
  *H01L 21/311*  (2006.01)
  *H01L 21/762*  (2006.01)

(52) U.S. Cl.
  CPC .... *H01J 37/32935* (2013.01); *H01L 21/3065* (2013.01); *H01L 21/31116* (2013.01); *H01L 22/10* (2013.01); *H01J 2237/3348* (2013.01); *H01L 21/76232* (2013.01)

(58) Field of Classification Search
  USPC ............ 118/723 R, 723 I, 723 IR, 723 MW, 118/723 ME, 723 MR
  See application file for complete search history.

(56) References Cited

U.S. PATENT DOCUMENTS

| | | | |
|---|---|---|---|
| 6,535,785 | B2 | 3/2003 | Johnson et al. |
| 2001/0045427 | A1 | 11/2001 | Thompson et al. |
| 2002/0123237 | A1 | 9/2002 | Nguyen et al. |
| 2006/0124245 | A1 | 6/2006 | Kikuchi et al. |
| 2007/0175856 | A1 | 8/2007 | Johnson et al. |
| 2008/0237031 | A1* | 10/2008 | Sato ................. H01J 37/32082 204/164 |
| 2010/0258529 | A1* | 10/2010 | Mori ................. H01J 37/32091 216/67 |

FOREIGN PATENT DOCUMENTS

| | | | |
|---|---|---|---|
| JP | 2001-085395 | A | 3/2001 |
| JP | 2007-509506 | A | 4/2007 |
| JP | 2010-016124 | * | 1/2010 |

OTHER PUBLICATIONS

English Machine Translation JP 2001085395, Ono et al dated Mar. 30, 2001.

* cited by examiner

ANALOG SIGNAL EXAMPLE 1

USABLE REPETITIVE FREQUENCY (CHANNEL) SETTING EXAMPLE

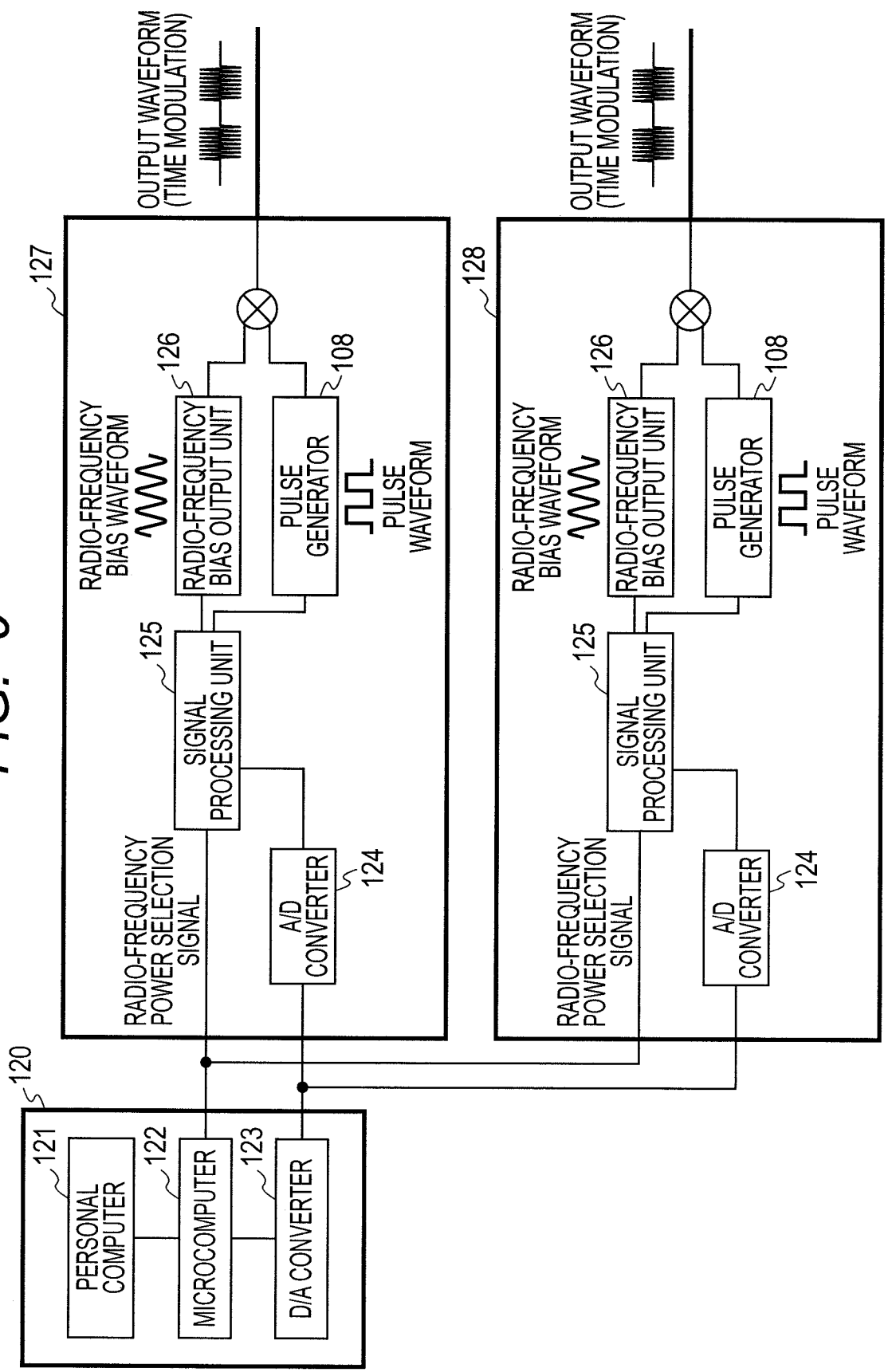

ANALOG SIGNAL VOLTAGE SETTING EXAMPLE IN RELATED ART

PLASMA PROCESSING APPARATUS AND PLASMA PROCESSING METHOD

CROSS REFERENCE TO RELATED APPLICATIONS

The present application is a continuation of U.S. patent application Ser. No. 13/185,598, filed Jul. 19, 2011, which claims priority from Japanese Patent Application No. 2011-076585, filed Mar. 30, 2011, the contents of both of which are hereby incorporated by reference into this application.

FIELD OF THE INVENTION

The present invention relates to a plasma processing apparatus and a plasma processing method, and more particularly, to a plasma processing apparatus and a plasma processing method suitable for etching a minute pattern with high precision by using plasma in order to process materials such as a semiconductor device, and the like.

BACKGROUND OF THE INVENTION

In the related art, as a method of processing the surface of a semiconductor device, an apparatus of etching the semiconductor device by using plasma is widely known. Herein, the related art will be described by using an electron cyclotron resonance (hereinafter, referred to as 'ECR') type plasma etching apparatus as an example. In this ECR type, the plasma is generated by microwaves in a vacuum vessel applying a magnetic field from the outside. Electrons perform cyclotron motion by the magnetic field and the plasma can be efficiently generated by resonating a frequency of the magnetic field and a frequency of the microwaves. In order to accelerate ions incident in the semiconductor device, radio-frequency power is applied to a sample as sequential waveforms substantially in a sinusoidal waveform. Herein, the radio-frequency power applied to the sample is, hereinafter, referred to as a radio-frequency bias. Further, as gas forming plasma, halogen gas such as chlorine or fluorine is widely used.

Radical or ions generated by the plasma react with an etched material, such that etching is performed.

A reaction product generated by etching causes reattachment to a pattern and an etching shape thereof is tapered. Therefore, in order to achieve high precision etching, control of the reaction product generated during etching becomes important. A method of shortening a stay time of the reaction product is used in order to reduce the concentration of the reaction product. When a stay time of gas in a plasma processing chamber is set as τ, in the case where P is a processing pressure, V is the capacity of the plasma processing chamber, and Q is a gas flow, τ has a relationship of τ=PV/Q and in apparatus configuration, the limitations of the P, V, and Q are defined. The stay time of the gaseous reaction product may be shortened by lowering a processing pressure or increasing the gas flow on the basis of the relationship, but it is difficult to enhance the increase of the gas flow and the lowering of the processing pressure in a trade-off relationship.

Further, in Japanese Patent Application Laid-Open Publication No. Hei8(1996)-250479, as a method of controlling the reaction product and increasing etching precision, temporal modulation of the plasma or radio-frequency bias is disclosed. In addition, In Japanese Patent Application Laid-Open Publication No. 2001-85395, the method of controlling the temporally modulated radio-frequency bias in which ion energy is with high precision controlled by dividing the radio-frequency bias into two or more is disclosed.

SUMMARY OF THE INVENTION

Parameters controlling temporal modulation of radio-frequency bias power include a repetition frequency and a ratio of an on time to one cycle (hereinafter, referred to as a duty ratio). At the time of performing etching, the repetition frequency, the duty ratio, and etching conditions such as etching gas a pressure, or the like are set in a control device by an input section. The set value is handled as a digital signal in the control device, but in the case where the control device and the radio-frequency bias power supply are connected to each other by an analog method, the digital signal is converted into an analog signal by a digital/analog converter (hereinafter, referred to as a D/A converter) in the control device and thereafter, transmitted. At the time of transmitting the analog signal, when an error occurs in noise for the signal, an output value varies with respect to the set value. For example, in the case where signals of 0 to 2000 Hz can be inputted by the unit of 1 Hz, resolution of approximately 0.98 Hz per 1 digit is made in digital signal processing of 12 bits. Herein, the digit means a binary digit number. As shown in FIG. 11, in the digital signal processing of 12 bits, when the analog signal is used as ±10 V, voltage per 1 digit is approximately 4.9 mV. When the analog signal deviates 4.9 mV or more due to noise, distortion of 1 digit or more may occur after conversion to the digital signal. In this case, since the resolution is approximately 0.98 Hz (approximately 1 Hz) per 1 digit, an error of 1 Hz or more may occur.

For example, when the repetition frequency is 10 Hz and the duty ratio is 10%, an off time of the radio-frequency bias is 90 ms. When the repetition frequency is 11 Hz and the duty ratio is 10%, the off time is 81.8 ms. In the case where an error of control precision is ±1 Hz, consequently, 10 Hz may be 11 Hz. In this case, an error of the off time is 8.2 ms. The reaction product is exhausted during the off time, but the stay time of the reaction product in general plasma etching is in the range of 50 to 500 ms, such that the error of 8.2 ms of the off time of the radio-frequency bias has a large influence on the stay time of the reaction product and affects precision in shape control. Further, when the repetition frequency is 1000 Hz and the duty ratio is 10%, the off time is 0.9 ms, but an error occurs due to noise and even in the case of a signal processing of 1001 Hz, the off time is 0.899 ms and the error is 0.001 ms. Therefore, an error of 0.1% just occurs. That is, in the case where the repetition frequency is low, the control precision or resolution of the signal needs to increase, but in the case where the repetition frequency is high, even the low frequency resolution has a small influence. As a result, in order to improve controllability of etching shape processing, the concentration of the reaction production needs to be controlled with high precision by improving the resolution of a low-frequency band of the repetition frequency.

Although the resolution can be increased by narrowing a used repetition frequency domain, an appropriate repetition frequency varies depending on etching gas or an etched target structure. As a result, in order to cope with a variety of gases or various etched target structure, a repetition frequency having a wide frequency band as possible is required. Therefore, it is difficult to achieve both widening of a usable domain of the repetition frequency and improving of the frequency resolution.

Further, pulse plasma known as a method of controlling dissociation of plasma can also be described similarly as the object. A radio-frequency applied to generate pulse plasma is temporally modulated to be pulsed, but even in this control, the frequency resolution needs to increase in order to achieve high-precision control.

The present invention has been made in an effort to provide a plasma processing apparatus with a radio-frequency power supply supplying temporally modulated intermittent radio-frequency power which can be controlled with high precision in a broad repetition frequency band and a plasma processing method using the plasma processing apparatus.

According to an embodiment of the present invention, there is provided a plasma processing apparatus including: a vacuum vessel; a first radio-frequency power supply for generating plasma in the vacuum vessel; a stage installed in the vacuum vessel and mounted with a sample; and a second radio-frequency applying voltage to the stage, wherein at least one of the first and second radio-frequency power supplies supply temporally modulated intermittent radio-frequency power, has two or more different frequency bands, and temporally modulates the radio-frequency power by a repetition frequency which has the same range of analog signals used in each of the frequency band.

According to another embodiment of the present invention, there is provided a plasma processing apparatus including: a vacuum vessel; a plasma generating section plasma in the vacuum vessel; a stage installed in the vacuum vessel and mounted with a sample; and a radio-frequency power supply applying temporally modulated intermittent radio-frequency power to the stage, wherein the radio-frequency power supply has two or more different frequency bands and temporally modulates the radio-frequency power by a repetition frequency which has the same range of analog signals used in each of the frequency bands.

According to yet another embodiment of the present invention, there is provided a plasma processing method using a plasma processing apparatus including a vacuum vessel, a plasma generating section plasma in the vacuum vessel, a stage installed in the vacuum vessel and mounted with a sample, and a radio-frequency power supply applying temporally modulated intermittent radio-frequency power to the stage, wherein the radio-frequency power supply has two or more different frequency bands and temporally modulates the radio-frequency power by a repetition frequency which has the same range of analog signals used in each of the frequency bands, and the sample is etched while applying the temporally modulated intermittent radio-frequency power at any one frequency of the frequency bands.

According to the embodiments of the present invention, it is possible to supply temporally modulated intermittent radio-frequency power which can be controlled with high precision in a broad repetition frequency band from at least one power supply of radio-frequency power supply generating plasma and a radio-frequency power supply applying voltage to a stage.

BRIEF DESCRIPTION OF THE DRAWINGS

FIG. 9 is a schematic diagram of a control device and a radio-frequency power supply according to an embodiment of the present invention;

DETAILED DESCRIPTION OF THE PREFERRED EMBODIMENTS

Figure 1:
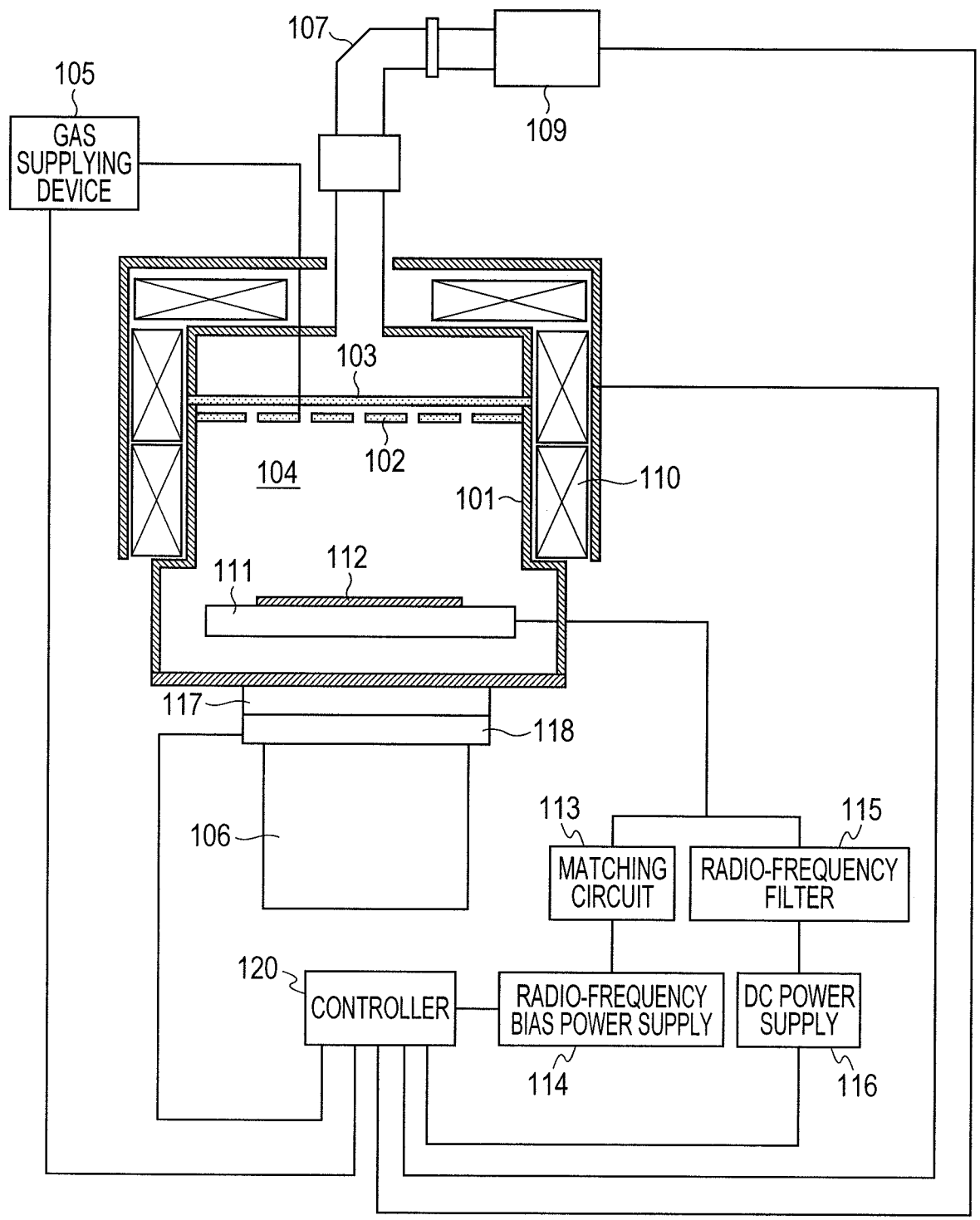
FIG. 1 is a longitudinal cross-sectional view of a microwave ECR plasma etching apparatus according to an embodiment of the present invention.

Hereinafter, embodiments of the present invention will be described with reference to the accompanying drawings. FIG. 1 is a schematic longitudinal cross-sectional view of an ECR plasma etching apparatus using microwaves according to an embodiment of the present invention. Further, like reference numerals refer to like elements.

A shower plate 102 (e.g., quartz) for injecting etching gas into a vacuum vessel 101 and a dielectric window 103 (e.g., quartz) are installed in an upper part of the vacuum vessel 101 with the upper part opened and sealed to form a processing chamber 104. A gas supplying device 105 for inflow of the etching gas is connected to the shower plate 102. Further, a vacuum exhaust device 106 is connected to the vacuum vessel 101 through an exhaust opening-closing valve 117 and an exhaust velocity variable valve 118. The vacuum exhaust device 106 is driven by opening the exhaust opening-closing valve 117 to lower a pressure in the processing chamber 104, which becomes a vacuum state. The pressure in the processing chamber 104 is adjusted to a desired pressure by the exhaust velocity variable valve 118. The etching gas flows into the processing chamber 104 from the gas supplying device 105 through the shower plate 102 and exhausted by the vacuum exhaust device 106 through the exhaust velocity variable valve 118. Further, a sample mounting electrode 111 which is a stage is installed in a lower part of the vacuum vessel 101 to face the shower plate 102.

In order to transmit power for generating plasma to the processing chamber 104, a waveguide 107 for transmitting electromagnetic waves is installed above the dielectric window 103. The electromagnetic waves transmitted to the waveguide 107 oscillate in an electromagnetic wave generating power supply 109. Meanwhile, an effect of the embodiment is not particularly limited to a frequency of the electromagnetic waves, but in the embodiment, a 2.45 GHz microwave is used. A magnetic field generating coil 110 for forming a magnetic field is installed outside the processing chamber 104 and the electromagnetic waves oscillated in the electromagnetic wave generating power supply 109 generates high-density plasma in the processing chamber 104 by interaction with the magnetic field formed by the magnetic field generating coil 110 and a wafer 112 which is a sample disposed on the sample mounting electrode 111 is etched. Since the shower plate 102, the sample mounting electrode 111, the magnetic field generating coil 110, the exhaust opening-closing valve 117, the exhaust velocity variable valve 118, and the wafer 112 are coaxially disposed on a central axis of the processing chamber 104, the flow of the etching gas or radical and ions generated by plasma and the reaction product generated by etching are coaxially injected into the wafer 112 and exhausted. The coaxial placement causes an etching rate and wafer in-plane uniformity to be close to axial symmetry and wafer processing uniformity to be improved. The surface of the sample mounting electrode 111 is coated with a sprayed film (not shown) and connected to a DC power supply 116 through a radio-frequency filter 115. Moreover, the radio-frequency bias power supply 114 is connected to the sample mounting electrode 111 through a matching circuit 113. The radio-frequency bias power supply 114 may selectively supply temporally modulated intermittent radio-frequency power or continuous radio-frequency power to the sample mounting electrode 111 with a radio-frequency bias output unit 126 and a pulse generator 108 (see FIG. 2). Further, the temporally modulated intermittent radio-frequency bias power is controlled by a repetition frequency which is the number of times at which a period (on period) to apply the radio-frequency bias power and a period (off period) not to apply the radio-frequency bias power are repeated per unit time and a duty ratio which is an on period per one cycle (the reciprocal of the repetition frequency).

Figure 2:
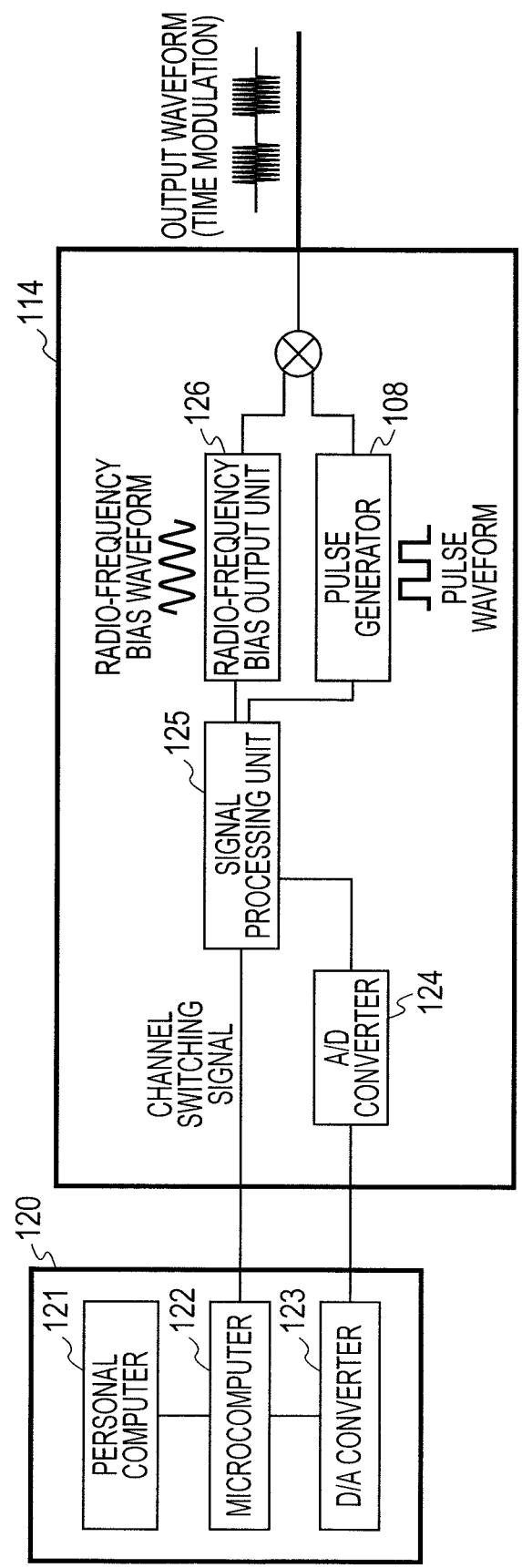
FIG. 2 is a schematic diagram of a control device and a radio-frequency bias power supply according to an embodiment of the present invention.

A control device 120 controlling etching using the ECR etching apparatus includes a PC 121 processing etching parameters such as the repetition frequency, the duty ratio, the amount of etched gas, a processing pressure, microwave power, coil current, and the like which are inputted by an input section (not shown), a microcomputer 122 performing signal processing, and a digital/analog converter (hereinafter, referred to as a D/A converter 123) converting a digital signal into an analog signal (see FIG. 2).

Further, the radio-frequency bias power supply 114 includes an analog to digital converter (hereinafter, referred to as an 'A/D converter') 124 converting the analog signal into the digital signal, a signal processor 125 that is constructed at least in part of hardware processing a signal transmitted from the microcomputer 122 and a signal transmitted from the A/D converter 124, a pulse generator 108 generating pulse waveforms of the repetition frequency and the duty ratio indicated from the signal processor 125, and a radio-frequency bias output unit 126 outputting the radio-frequency bias indicated by the signal processor (see FIG. 2).

Hereinafter, a function of the control device 120 in the case of supplying the temporally modulated intermittent radio-frequency power to the sample mounting electrode from the radio-frequency bias power supply 114 will be described with reference to FIG. 2.

By the input section (not shown), the repetition frequency and the duty ratio inputted into the PC 121 are processed by the microcomputer 122 as the digital signals, converted into the analog signals through the D/A converter 123, and transmitted to the radio-frequency bias power supply 114. The analog signal received by the radio-frequency bias power supply 114 is converted into the digital signal by the A/D converter 124 and processed by the signal processor 125, such that the radio-frequency bias power and the pulse waveform are outputted from the radio-frequency bias output unit 126 and the pulse generator 108, respectively. The outputted pulse waveform is overlapped with the outputted radio-frequency bias power, such that the temporally modulated intermittent radio-frequency power is supplied from the sample mounting electrode 111 from the radio-frequency bias power supply 114.

Next, in the case of the repetition frequency of the radio-frequency bias power supply 114, a case in which the range of 1 to 2000 Hz is used by the unit of 1 Hz, in particular, a frequency band of 1 to 119 Hz is controlled at high resolution will be described.

The frequency band of 1 to 119 Hz is set as channel 1 and the frequency band of 120 to 2000 Hz is set as channel 2. Further, the D/A converter 123 and the A/D converter 124 of 12 bits are used and a voltage value of the analog signal is in the range of ±10 V. Meanwhile, in the case where the analog signal is in the range of ±10 V, the analog signal in the range of 0 to 10 V is generally used.

Figure 3:
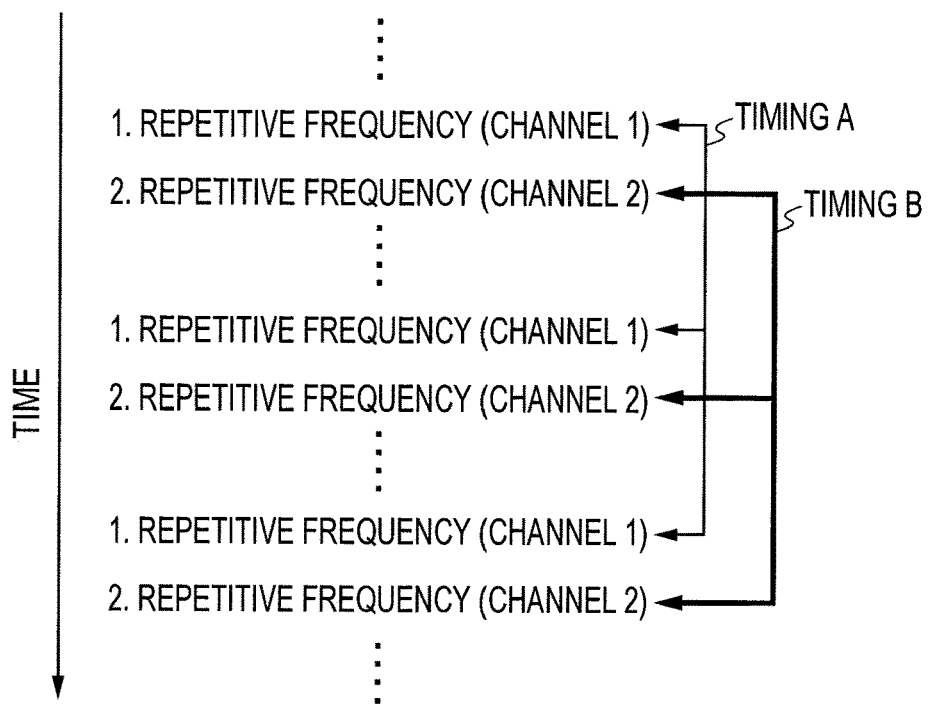
FIG. 3 is a diagram showing transmission of an analog signal.

For example, when the repetition frequency of 60 Hz is inputted into the PC 121, both the signals of channel 1 and channel 2 are periodically transmitted to the A/D converter 124 from the microcomputer 122 through the D/A converter 123 with different times as shown in FIG. 3. The signal processor 125 synchronizes signal reception with timing A (channel 1) in accordance with a channel switching signal for selecting channel 1 transmitted from the microcomputer 122 to select the signal of channel 1 from the signals of channel 1 and channel 2 transmitted from the A/D converter 124. The signal processor 125 selecting the signal of channel 1 generates a pulse waveform of 60 Hz from the pulse generator 108 to output the temporally modulated intermittent radio-frequency power of the repetition frequency of 60Hz from the radio-frequency bias power supply 114.

Figure 4:
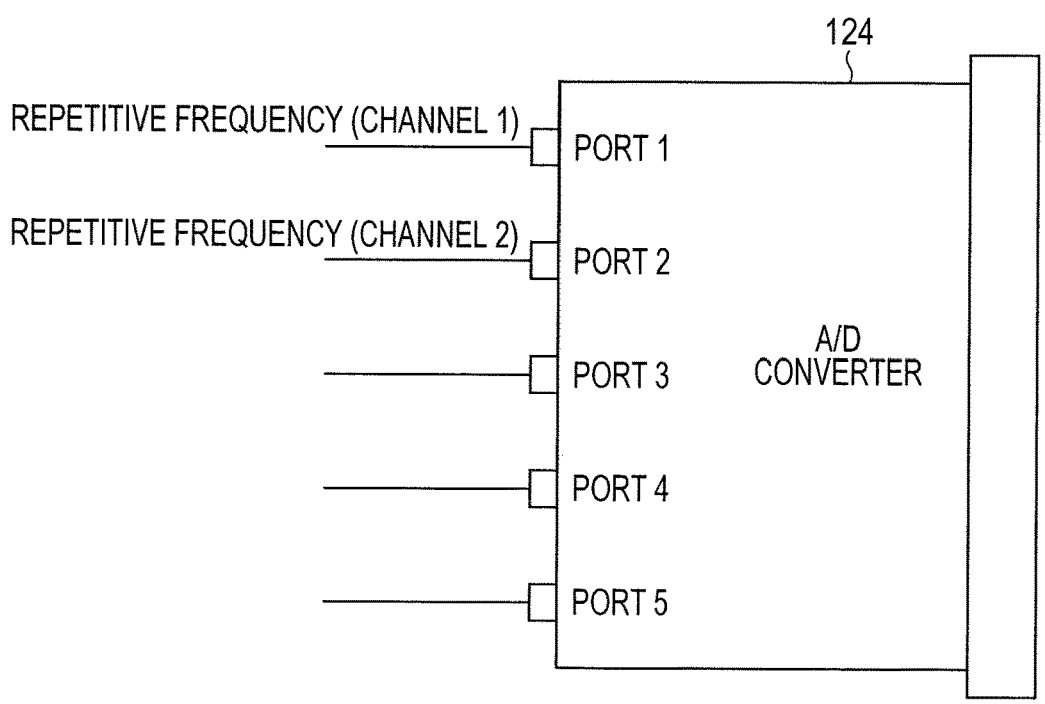
FIG. 4 is a schematic diagram of an A/D converter.

Further, as another method of channel selection of the signal processor 125, in the case where plural input/output terminals (hereinafter, referred to as ports) are provided in the A/D converter 124 as shown in FIG. 4, a method judging whether any channel is selected by the channel switching signal and selecting a signal of a predetermined port may be used. For example, in the case of the repetition frequency of 60 Hz, the signal processor 125 may judge port 1 to be selected (see FIG. 4).

Figure 5:
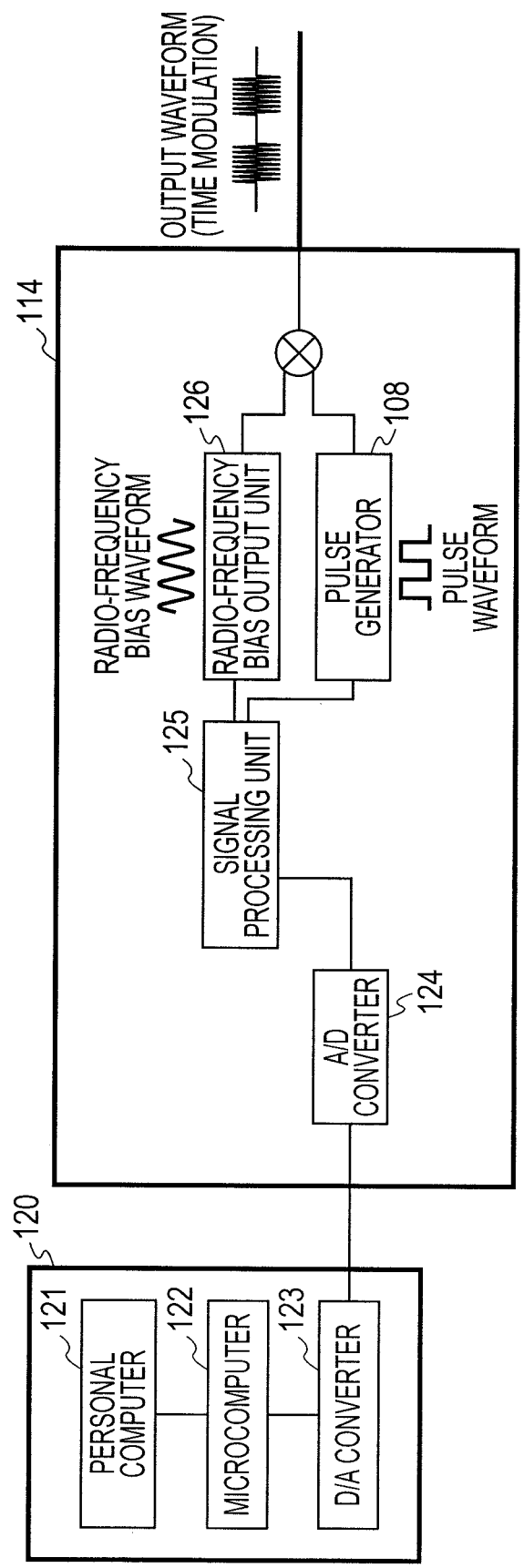
FIG. 5 is a schematic diagram of a control device and a radio-frequency bias power supply according to an embodiment of the present invention.

In addition, only the used channel may be transmitted to the A/D converter 124 from the microcomputer 122 through the D/A converter 123. For example, in the case where the repetition frequency is set as 10 Hz, only the signal of channel 1 is transmitted and the signal of channel 2 is not transmitted. In the case where the A/D converter 124 has the configuration shown in FIG. 4, the signal processor 125 judges whether or not the received signal is present in the port and when the signal is in port 1 and no signal is in port 2, the signal processor 125 may select port 1, i.e., channel 1. In this case, since the channel switching signal is not required, the configuration of FIG. 5 may also be applied.

However, the etching may be continuously performed in plural steps and in the case where frequencies (other channels) of different frequency bands are used in the steps, the method (see FIG. 4) of selecting the channel by the switching signal while transmitting signals of different channels periodically at all times at different transmission timings can change the channel more quickly than the method in which the switching signal is not required. Therefore, the channel selection method shown in FIG. 4 is preferable.

Next, frequency resolutions of channel 1 and channel 2 in the embodiment will be described.

In general, the frequency resolution is determined by processing capacities of the D/A converter 123 and the A/D converter 124 and a range of frequency bands. The D/A converter 123 and the A/D converter 124 of 12 bits may handle a signal of 4096 digits. The digit means the binary digit number. In this case, values of 4096 types of signals can be handled when the analog signal is in the range of ±10 V. Since 0 to 10 V is generally used as the analog signal, values of 2048 types of signals can be handled. In the embodiment, since a use range of the repetition frequency of channel 1 is 1 to 119 Hz, resolution of approximately 0.058 Hz is made. Further, since a use range of the repetition frequency of channel 2 is 120 to 2000 Hz, resolution of approximately 0.92 Hz is made. In addition, in order to handle a signal of 2048 digits when the use range of the analog signal is 10 V, 1 digit is equivalent to approximately 4.9 mV. That is, in the case where the analog signal is approximately 4.9 mV, the repetition frequency of approximately 0.058 Hz is represented in the channel 1 and the repetition frequency of approximately 0.92 Hz is represented in the channel 2. As a result, when an error of 4.9 mV occurs in the analog signal, an error of approximately 0.058 Hz occurs in the channel 1 and an error of approximately 0.92 Hz occurs in the channel 2.

For example, in the case where the duty ratio is 10% at the repetition frequency of 10 Hz (channel 1), the off time is 90 ms. In the case where noise of approximately 0.05% (5 mV) occurs in the analog signal, an error of approximately 0.058 Hz or more occurs in the repetition frequency. In the case where the duty ratio is 10% at the repetition frequency of 10.058 Hz, the off time is 89.5 ms and the error is approximately 0.56%. For example, in the case where the duty ratio is 10% at the repetition frequency of 1000 Hz (channel 2), the off time is 0.9 ms. When noise of approximately 0.05% (5 mV) occurs in the analog signal due to the noise, the analog signal a is processed as a signal of approximately 1001 Hz, such that the off time is 0.899 ms and the error is 0.001 ms, and an error is 0.001 ms, and an error of 0.1% merely occurs.

Therefore, in the embodiment, as described above, the use frequency range of the repetition frequency is divided into a frequency band in which the precision of the resolution is required and a frequency band in which the precision of the resolution is not nearly required, such that the repetition frequency can be controlled with high precision in a high range of frequency band of the repetition frequency.

Further, in the embodiment, a setting unit of the repetition frequency is 1 Hz, such that about 20 digits can be allocated per 1 Hz and the error due to noise can be excluded when the frequency band of channel 1 is selected.

Further, since the resolution of channel 1 is 0.058 Hz, the setting unit of the repetition frequency of channel 1 can be controlled to 1 Hz or less.

In addition, in the embodiment, the frequency band of the repetition frequency is divided into two, but may be divided into two or more frequency bands. As the division number increases, the resolution of each frequency band can be improved.

Figure 6:
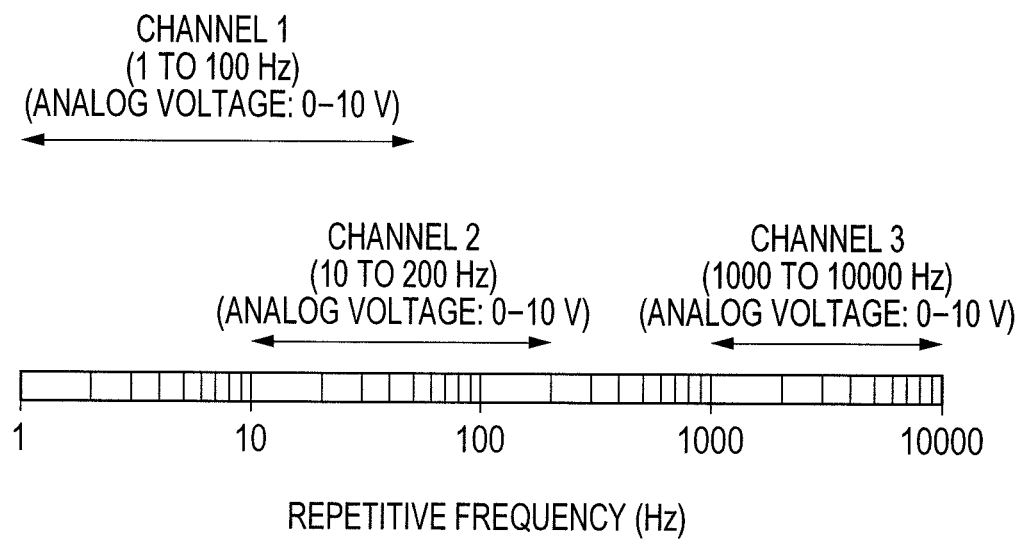
FIG. 6 is a diagram showing a setting example of a channel.

Further, in the embodiment, the frequency band of the repetition frequency is divided into two, but the use frequency range of the repetition frequency may be widened by combining two or more different frequency bands as shown in FIG. 6. As described above, the use frequency range of the repetition frequency is widened by combining different frequency bands, thereby improving the precision of each frequency band.

In addition, when the on time of the temporally modulated intermittent radio-frequency bias power is short, it is difficult to match the radio-frequency bias power. The on time is defined by the duty ratio and the repetition frequency, but when the duty ratio is a low duty ratio such as 20% or less, the on time in the repetition frequency of the radio-frequency band of channel 2 is short, such that the radio-frequency bias power may not be applied to the sample mounting electrode 111. As a result, when the repetition frequency of the frequency band of channel 2 is used, the duty ratio of 20% or more is preferably used.

Next, a plasma processing method in which the microwave ECR plasma etching apparatus according to the embodiment is used and the wafer 112 is etched will be described.

Further, a plasma processing method in the case where the use frequency range of the repetition frequency of the temporally modulated intermittent radio-frequency bias is divided into two frequency bands to be configured by two frequency bands of channel 1 (1 to 119 Hz) and channel 2 (120 to 2000 Hz) will be described.

Figure 7A:
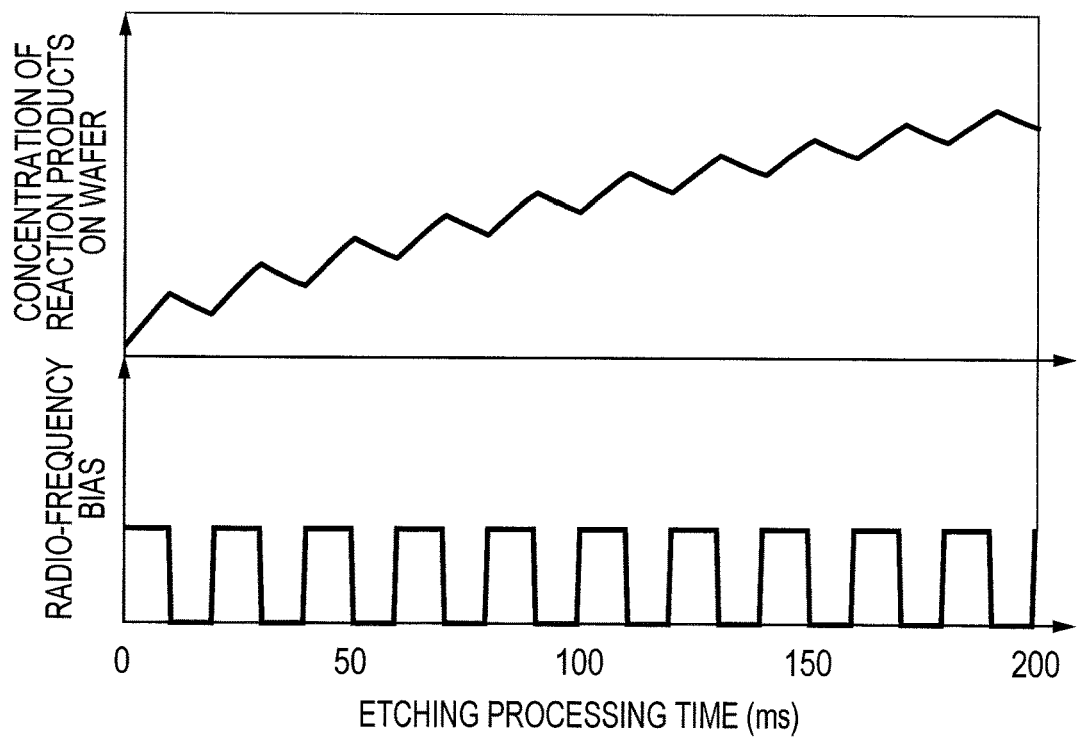
FIGS. 7A and 7B are a diagram showing temporal dependence of the concentration of a reaction product on an etching time.
Figure 7B:
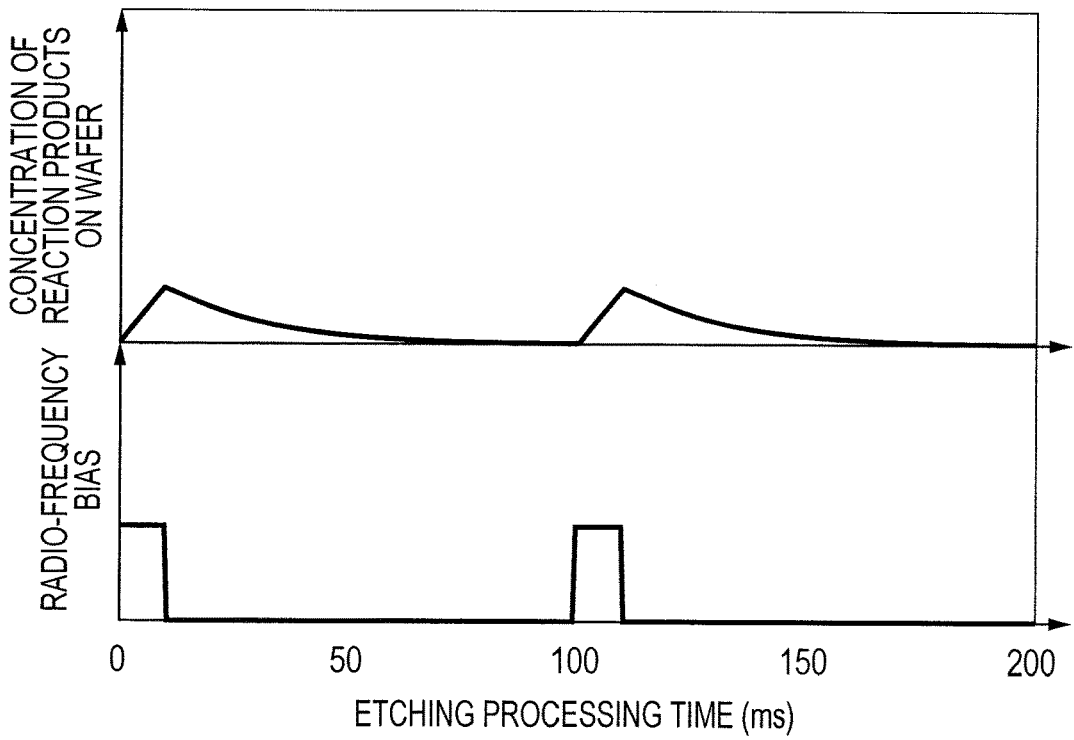

Although the temporally modulated intermittent radio-frequency bias may be used to control the concentration of the reaction product and control etching performance, a large effect can be obtained when the off time is the same as the stay time of the reaction product. During the on time of the temporally modulated intermittent radio-frequency bias, etching is performed and the reaction production is continuously generated. When the temporally modulated intermittent radio-frequency bias is off, etching is not performed and the reaction production is exhausted. In a general plasma etching apparatus, the stay time of the reaction product is in the range of 10 to 1000 ms under the processing pressure in the range of 0.1 to 10 Pa. As one example, a case in which the stay time of the reaction product is 80 ms will be described. In continuous radio-frequency bias, the concentration of the reaction product increases monotonically from the time when etching starts. Dependence of the reaction product on an etching time is shown in FIG. 7A, when the stay time of the reaction product is 80 ms, the on time of the temporally modulated intermittent radio-frequency bias is 10 ms, and the off time is 10 ms. When the off time is shorter than the stay time of the reaction product, the concentration of the reaction product increases as time elapsed because the reaction product remains. Next, when the stay time of the reaction product is 80 ms, the on time of the temporally modulated intermittent radio-frequency bias is 10 ms, the off time of the temporally modulated intermittent radio-frequency bias is 80 ms, in the case where the stay time of the reaction product is equivalent to the off time, the dependence of the reaction product on the etching time is shown in FIG. 7B. The reaction product generated during the on time is exhausted at the off time and thus does not remain, the concentration of the reaction product may be low. By setting the off time longer than the stay time of the reaction product, the concentration of the reaction product may decrease.

Figure 8A:
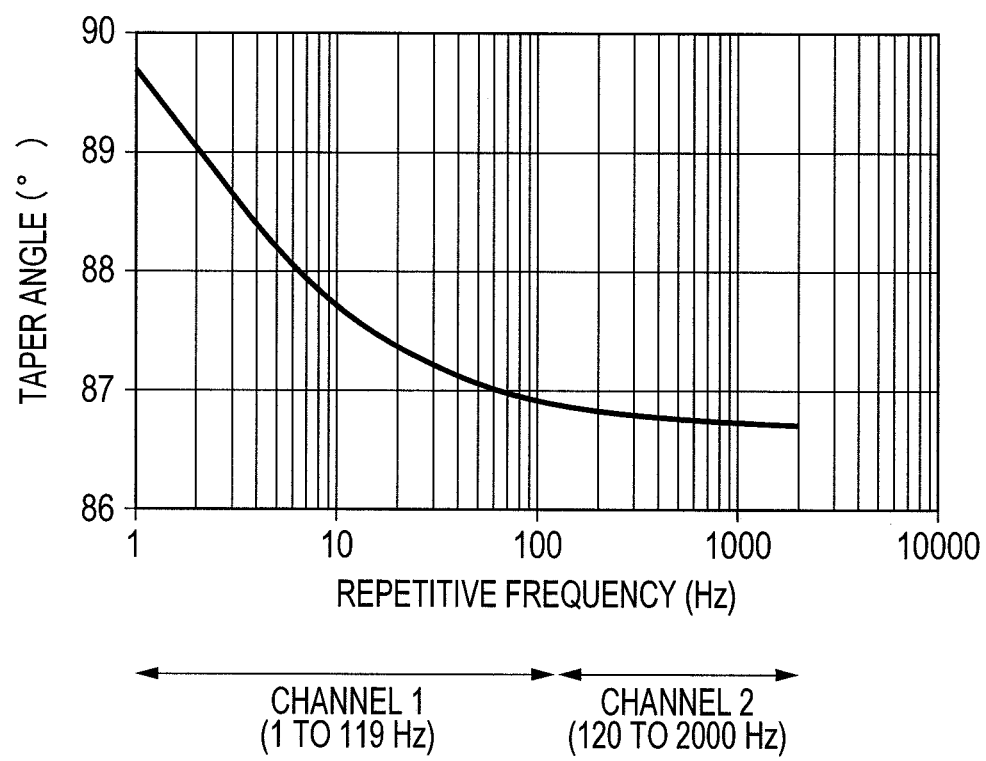
FIGS. 8A and 8B are a diagram showing dependence of a taper angle of an etching shape on an off time of a repetition frequency or temporally modulated intermittent radio-frequency bias power.
Figure 8B:
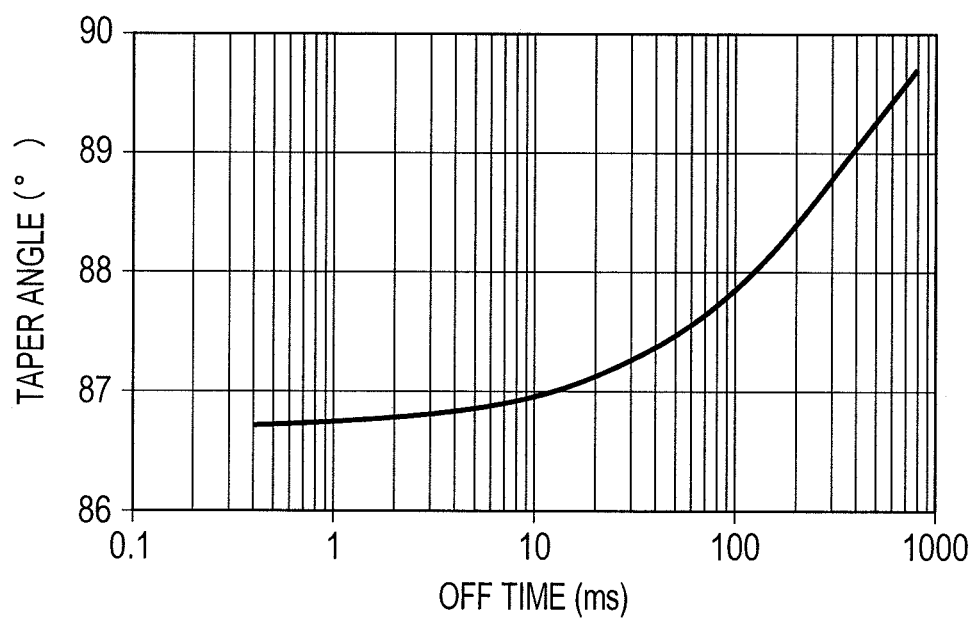

Next, dependence of a taper angle of an etching shape of a line on the repetition frequency when the duty ratio is fixed to 20% and a line of a silicon nitride layer is etched is shown in FIG. 8A. As the repetition frequency decreases, the etching shape is close to be vertical. Although the off time is established by the repetition frequency and the duty ratio, in the result of FIG. 8A, the off time increases, such that the concentration of the reaction product decreases and attachment of the reaction product decreases. FIG. 8A shows the dependence of the taper angle on the repetition frequency and FIG. 8B shows dependence of the taper angle on the off time, but the taper angle can be controlled by increasing the off time as compared with FIG. 8B. In particular, when the off time is in the range of 10 to 1000 ms, the vertical etching shape can be acquired.

As described above, by setting the off time longer than the stay time of the reaction product, the concentration of the reaction product may decrease. In order to increase the off time, the repetition frequency should decrease and the duty ratio should decrease. For example, FIG. 7B shows an example in which the wafer 112 is plasma-etched by applying, to the sample mounting electrode 111, the temporally modulated intermittent radio-frequency bias power in which the repetition frequency is 11.1 Hz and the duty ratio 11.1%.

Accordingly, in the embodiment, even in a low-frequency repetition frequency band to increase the off time, the frequency can be controlled with high precision, and as a result, the concentration of the reaction product can be controlled with high precision. Therefore, the etching shape can be controlled with high precision.

Further, a radio-frequency repetition frequency band may need to be used depending on a type of an etched film or a target etching process, an etching condition, and the like. However, since the on time and the off time in the radio-frequency repetition frequency are very short, the frequency resolution may not mostly be higher than that of the low-frequency repetition frequency.

In addition, the etching process is various and in some processes, not vertical processing but a taper shape may be needed. As one example, a shallow trench isolation (hereinafter, referred to as 'STI') is etched. After STI etching, the taper shape is, as a whole, required for implantation. When the etching shape is processed in the taper shape, in the case where an etching characteristic shown in FIG. 8A is provided, the repetition frequency is preferably high. As described above, in order to widely apply to various processes of semiconductor manufacture, the repetition frequency can be preferably used extensively.

Moreover, in the plasma processing method, the use frequency range of the repetition frequency of the temporally modulated intermittent radio-frequency bias is divided into two frequency bands, but the same effect as the plasma processing method can be obtained even when the use frequency range of the repetition frequency is divided into two or more frequency bands. In addition, even when the use frequency range of the repetition frequency is configured by combination of two or more different frequency bands, the same effect as the plasma processing method can be obtained.

According to the embodiment of the present invention, in order to establish the above-mentioned configuration, high-precision etching can be performed in various etching processes so as to supply the temporally modulated intermittent radio-frequency bias power of the repetition frequency controlled with high precision in the wide frequency band to the mounting electrode.

Figure 10:
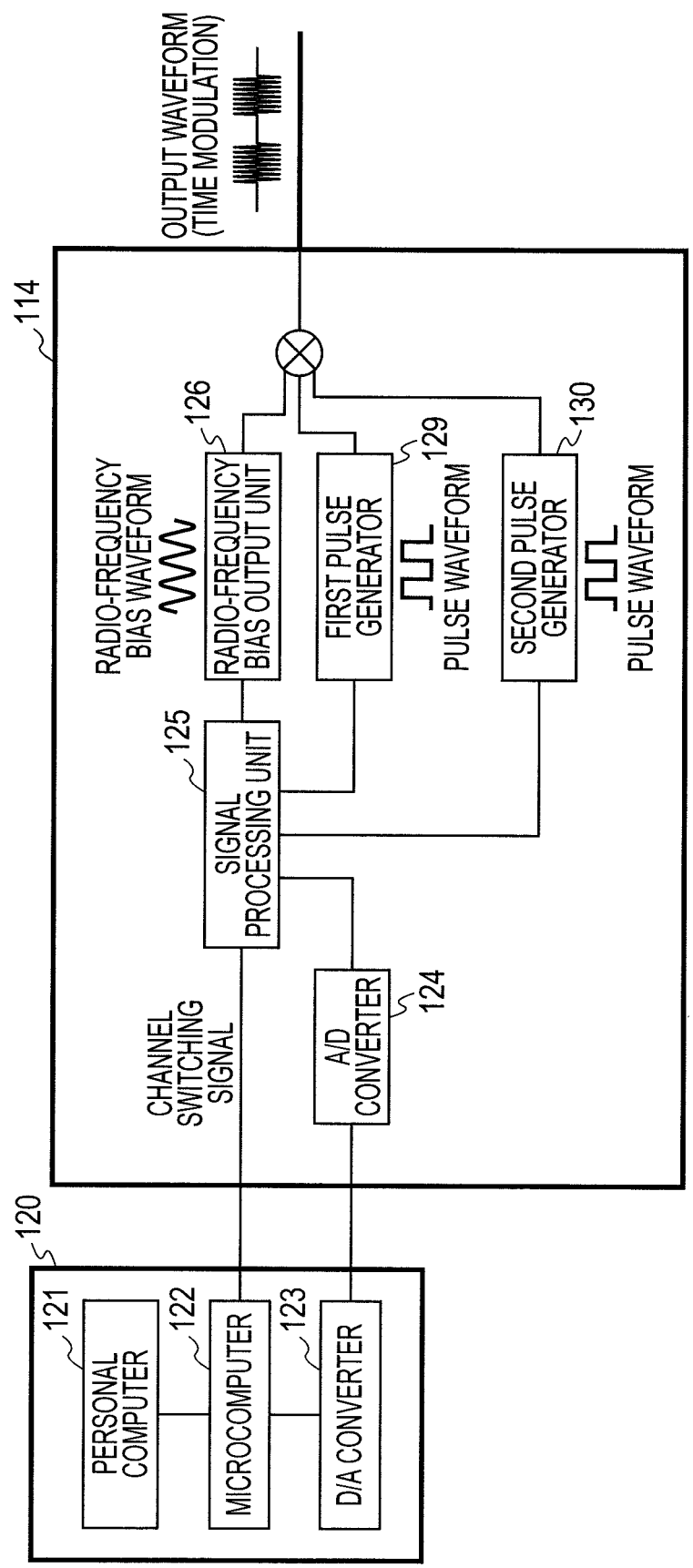
FIG. 10 is a schematic diagram of a control device and a radio-frequency bias power supply according to an embodiment of the present invention.
Figure 11:
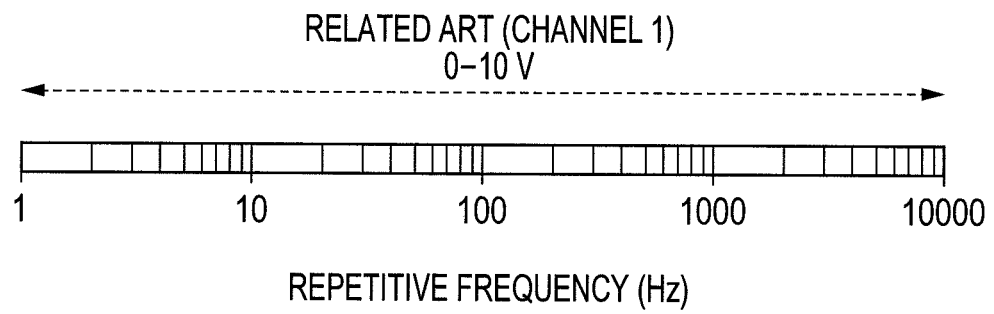
FIG. 11 is a diagram showing a setting example of an analog signal in the related art.

Further, in the embodiment, plural channels of the frequency band of the repetition frequency are switched by the channel switching signal, but a method of using plural radio-frequency bias power may be used. For example, as shown in FIG. 9, in the case of two channels, two radio-frequency power supplies outputting the temporally modulated intermittent radio-frequency bias power are installed in each of two channels and a first radio-frequency power supply 127 and a second radio-frequency power supply 128 are switched by a radio-frequency power supply selection signal, such that the temporally modulated intermittent radio-frequency bias power of the repetition frequency controlled with high precision in the wide frequency band can be supplied to the mounting electrode. Further, as shown in FIG. 10, instead of the plural radio-frequency power supplies, plural pulse generators (a first pulse generator 129 and a second pulse generator 130) generating pulse waveforms of repetition frequencies of different frequency bands may be formed in the radio-frequency bias power supply.

The configuration of the radio-frequency bias power supply of the embodiment may be applied even to the radio-frequency power supply generating plasma. As a result, in the plasma processing apparatus according to the embodiment of the present invention, the temporally modulated intermittent radio-frequency power which can be controlled with high precision in the wide repetition frequency band is supplied from at least one power supply of the radio-frequency power supply generating plasma and the radio-frequency bias power supply.

Further, in the embodiment, the microwave ECR plasma has been described as an embodiment, but the same effect as the embodiment can be obtained even in plasma processing apparatuses using other plasma generation methods such as capacitive-coupled plasma or inductive-coupled plasma.

What is claimed is:

1. A plasma processing apparatus, comprising:
   a vacuum chamber in which a sample is plasma processed;
   a first radio-frequency power supply supplying a first radio frequency power to generate a plasma;
   a sample stage on which the sample is mounted;
   a second radio-frequency power supply supplying a second radio-frequency power to the sample stage; and
   a control device comprising an input section, a microcomputer, and a D/A converter, wherein the control device is configured to convert a repetition frequency of a pulse for time-modulating the second radio-frequency power to a first analog value corresponding to a first frequency band of the repetition frequency and a second analog value corresponding to a second frequency band of the repetition frequency, the second frequency band being wider than the first frequency band of the repetition frequency;
   wherein the second radio-frequency power supply includes:
   an A/D converter having a plurality of output ports thereon, the A/D converter configured to receive the first analog value and the second analog value, and to convert the first analog value and the second analog value transmitted by the control device to a first digital signal and a second digital signal, respectively, wherein the A/D converter is further configured to output the first digital signal on the first output port and to output the second digital signal on the second output port;
   a signal processor constructed at least in part of hardware configured to select the first output port on which is output the first digital signal converted by the A/D converter or the second output port on which is output the second digital signal converted by the A/D converter based on a channel switching signal received by the signal processor from the control device, wherein said channel switching signal corresponds to the first and second digital signals, and wherein said channel switching signal is based on the second radio-frequency power; and
   a pulse generator configured to generate pulses having a repetition frequency corresponding to the first digital signal or the second digital signal selected by the signal processor.

2. The plasma processing apparatus according to claim 1, wherein at least one of the first and second radio-frequency power supplies includes at least as many radio-frequency power supplies as a number of the two or more different frequency bands.

3. A plasma processing apparatus, comprising:
- a vacuum chamber in which a sample is plasma processed;
- a first radio-frequency power supply supplying a first radio-frequency power to generate a plasma;
- a sample stage on which the sample is mounted;
- a second radio-frequency power supply supplying a second radio-frequency power to the sample stage;
- a control device comprising an input section, a microcomputer, and a D/A converter, wherein the control device is configured to convert a repetition frequency of a pulse for time-modulating the first radio-frequency power to a first analog value corresponding to a first frequency band of the repetition frequency and a second analog value corresponding to a second frequency band of the repetition frequency, the second frequency band being wider than the first frequency band of the repetition frequency;

wherein the first radio-frequency power supply includes:
- an A/D converter having a plurality of output ports thereon, the A/D converter configured to receive the first analog value and the second analog value, and to convert the first analog value and the second value transmitted by the control device to a first digital signal and a second digital signal, respectively, wherein the A/D converter is further configured to output the first digital signal on the first output port and to output the second digital signal on the second output port;
- a signal processor constructed at least in part of hardware configured to select the first output port on which is output the first digital signal converted by the A/D converter or the second output port on which is output the second digital signal converted by the A/D converter based on a channel switching signal received by the signal processor from the control device, wherein said channel switching signal corresponds to the first and second digital signals, and wherein said channel switching signal is based on the first radio-frequency power; and
- a pulse generator configured to generate pulses having a repetition frequency corresponding to the first digital signal or the second digital signal selected by the signal processor.

4. The plasma processing apparatus according to claim 1, wherein the second radio-frequency power supply includes at least as many radio-frequency power supplies as a number of the two or more different frequency bands.

* * * * *